(12) United States Patent
Kim et al.

(10) Patent No.: US 9,312,474 B2
(45) Date of Patent: Apr. 12, 2016

(54) ELECTRONIC DEVICES HAVING SEMICONDUCTOR MEMORY UNITS HAVING MAGNETIC TUNNEL JUNCTION ELEMENT

(71) Applicant: SK hynix Inc., Icheon-Si (KR)

(72) Inventors: Guk-Cheon Kim, Icheon-Si (KR); Ki-Seon Park, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 83 days.

(21) Appl. No.: 14/142,896

(22) Filed: Dec. 29, 2013

(65) Prior Publication Data

US 2014/0299950 A1    Oct. 9, 2014

(30) Foreign Application Priority Data

Apr. 9, 2013   (KR) .................. 10-2013-0038682

(51) Int. Cl.
*H01L 29/82* (2006.01)
*H01L 43/08* (2006.01)
*H01L 27/22* (2006.01)

(52) U.S. Cl.
CPC .............. *H01L 43/08* (2013.01); *H01L 27/228* (2013.01)

(58) Field of Classification Search
CPC ..... H01L 43/08; H01L 29/82; H01L 23/5226; H01L 23/528; H01L 27/222; H01L 43/065; G11C 11/02
USPC ....................... 257/421–427, E29.323; 438/3; 360/324–326, 313; 365/157–158
See application file for complete search history.

(56) References Cited

U.S. PATENT DOCUMENTS

| | | | |
|---|---|---|---|
| 6,937,497 B1* | 8/2005 | Ju et al. .................. | 365/130 |
| 6,992,910 B1* | 1/2006 | Ju et al. .................. | 365/130 |
| 2003/0048658 A1* | 3/2003 | Chen ....................... | 365/158 |
| 2004/0137645 A1* | 7/2004 | Hu et al. .................. | 438/3 |
| 2006/0175675 A1* | 8/2006 | Braun ............. | H01L 27/222 257/421 |
| 2011/0014500 A1* | 1/2011 | Horng et al. ............. | 428/846.3 |
| 2012/0218813 A1* | 8/2012 | Oh et al. .................. | 365/158 |

FOREIGN PATENT DOCUMENTS

KR     1020100047985     5/2010

* cited by examiner

*Primary Examiner* — Jami M Valentine
(74) *Attorney, Agent, or Firm* — Perkins Coie LLP

(57) ABSTRACT

Disclosed are electronic devices comprising a semiconductor memory unit capable of reducing the switching current of a variable resistance element for switching between different resistance states. One implementation of a disclosed electronic device may include a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer.

17 Claims, 15 Drawing Sheets

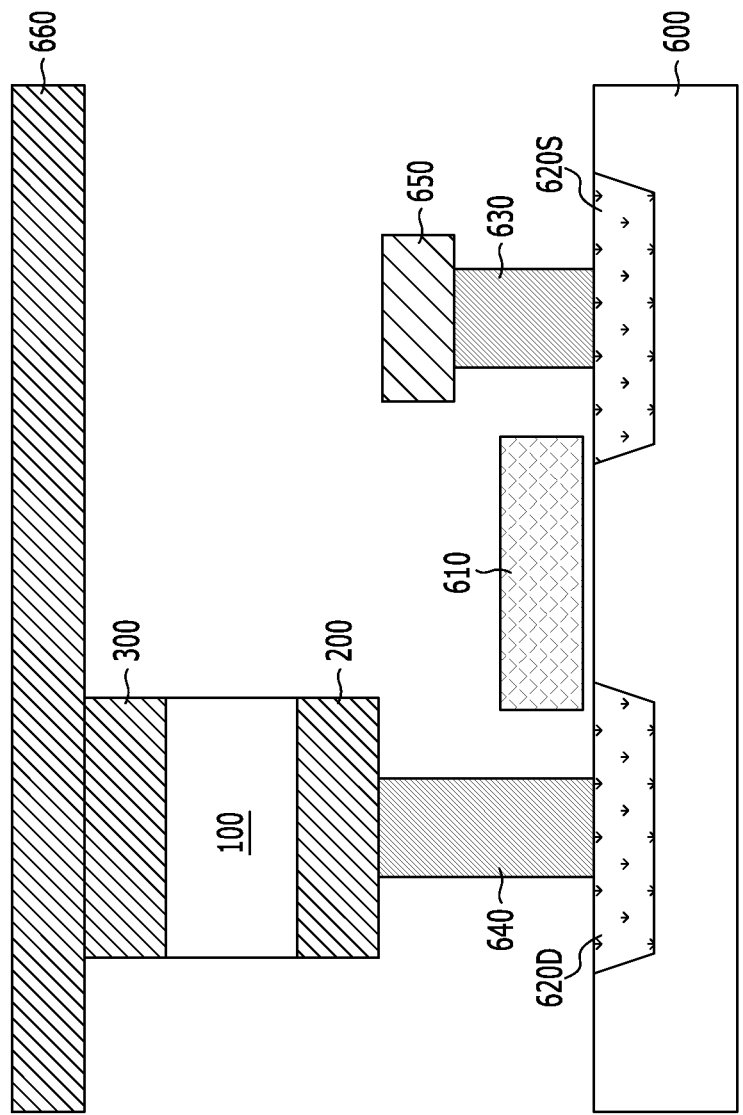

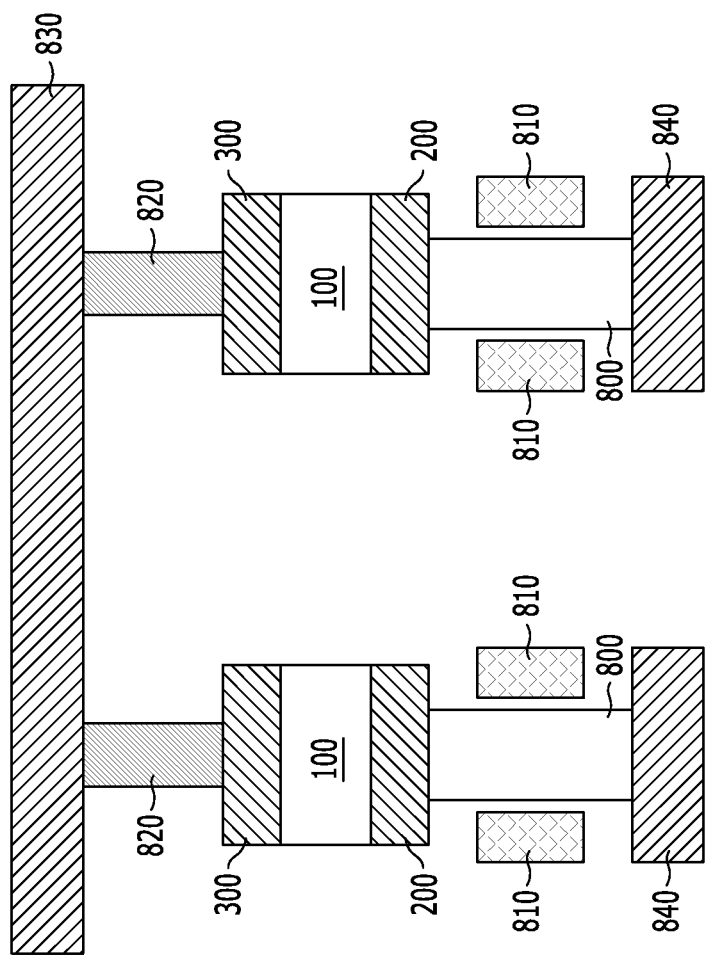

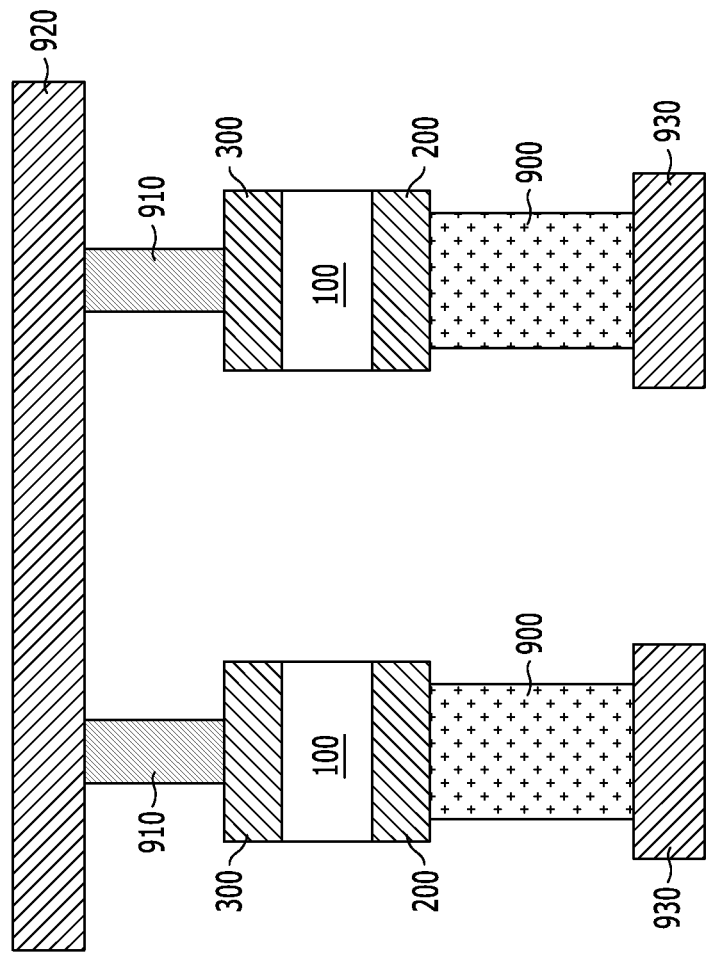

ELECTRONIC DEVICES HAVING SEMICONDUCTOR MEMORY UNITS HAVING MAGNETIC TUNNEL JUNCTION ELEMENT

CROSS-REFERENCE TO RELATED APPLICATIONS

The present application claims priority of Korean Patent Application No. 10-2013-0038682, entitled "SEMICONDUCTOR DEVICE, AND MICROPROCESSOR, PROCESSOR, SYSTEM, DATA STORAGE SYSTEM AND MEMORY SYSTEM INCLUDING THE SEMICONDUCTOR DEVICE" and filed on Apr. 9, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic that switched between different resistance states according to an applied voltage or current, and can be implemented in various configurations, for example, resistive random access memory (RRAM), phase-change random access memory (PRAM), ferroelectric random access memory (FRAM), magnetic random access memory (MRAM), an E-fuse, etc.

SUMMARY

The disclosed technology in this patent document includes memory circuits or devices and their applications in electronic devices or systems and various implementations of an electronic device in which a switching current necessary to change the magnetization direction of a magnetization free layer is reduced/minimized by increasing spin transfer torque (STT) efficiency by controlling a relative angle between the magnetization directions of a magnetization pinned layer and the magnetization free layer.

In one aspect, an electronic device is provided to include a semiconductor memory unit that includes: a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer.

Implementations of the above electronic device may include one or more the following.

The second magnetic layer and the third magnetic layer may be magnetically subject to exchange coupling. The second magnetic layer and the third magnetic layer may be ferromagnetically coupled. The second magnetic layer and the third magnetic layer may be anti-ferromagnetically coupled. The first magnetic layer may be magnetized parallel or anti-parallel to the magnetization direction of the third magnetic layer. The first direction may be horizontal to a surface of the layer. The second direction may be inclined from the first direction at an angle of greater than 0 degree to less than 90 degrees. The second direction may be inclined from a direction vertical to a surface of the layer to a direction horizontal to the surface of the layer. The second direction may be inclined from the first direction at an angle of greater than 90 degrees to less than 180. The second direction may be inclined from the first direction at an angle of greater than 180 degrees to less than 270 degrees. The second direction may be inclined from the first direction at an angle of greater than 270 degrees to less than 360 degrees. The semiconductor memory unit may further include an anti-ferromagnetic layer suitable for come in contact with the third magnetic layer on a side opposite to the non-magnetic layer. The first magnetic layer may comprise a lower magnetic layer, an upper magnetic layer, and a non-magnetic layer interposed between the lower magnetic layer and the upper magnetic layer. The semiconductor memory unit may further include a first conductive layer coupled with the first magnetic layer, and a second conductive layer coupled with the third magnetic layer. The first conductive layer may be a seed layer, and the second conductive layer may be a capping layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor performs the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

In another aspect, an electronic device is provided to include a semiconductor memory unit that includes: a magnetization free layer having a variable magnetization direction and an easy magnetization axis in a first direction; a magnetization pinned layer having a magnetization that is pinned in the first direction; and a reference layer between the magnetization free layer and the magnetization pinned layer and having a magnetization angle inclined from an initial direction due to a magnetic exchange coupling between the reference layer and the magnetization pinned layer.

Implementations of the above electronic device may include one or more the following.

The electronic device may further comprises: a tunnel barrier layer between the magnetization free layer and the reference layer; and a non-magnetic layer between the reference layer and the magnetization pinned layer to enable the magnetic exchange coupling between the reference layer and the magnetization pinned layer. The reference layer and the magnetization pinned layer may be ferromagnetically coupled. The reference layer and the magnetization pinned layer may be anti-ferromagnetically coupled. The first direction may be parallel to a surface of the layer. The second direction may be inclined from the first direction at an angle of a first value which is greater than 0 degree and less than 90 degrees, a second value which is greater than 180 degrees and less than 270 degrees, or a third value which is greater than 270 degrees and less than 360 degrees.

In another aspect, an electronic device comprising a semiconductor memory unit that includes: a magnetization free layer having a variable magnetization direction and an easy magnetization axis in a first direction; a tunnel barrier layer in contact with the magnetization free layer; and a synthetic anti-ferromagnetic (SAF) layer having a first surface in contact with the tunnel barrier layer and a second surface, the SAF layer, wherein the SAF layer includes (1) a magnetization pinned layer separated from the tunnel barrier layer and providing the second, the magnetization pinned layer having a magnetization that is pinned in a fixed direction, (2) a non-magnetic layer separated from the tunnel barrier layer and in contact with the magnetization pinned layer, and (3) a reference layer in contact with the tunnel barrier layer and in contact with the non-magnetic layer, and wherein the reference layer is in magnetic exchange coupling with the magnetization pinned layer to exhibit an inclined magnetization in a direction at an angle between a direction perpendicular to the SAF layer and a direction parallel to the SAF layer.

Implementations of the above electronic device may include one or more the following.

The reference layer and the magnetization pinned layer may be ferromagnetically coupled. The reference layer and the magnetization pinned layer are anti-ferromagnetically coupled.

In another aspect, a method for reducing a current for switching a magnetization of a variable resistance element comprises: providing a variable resistance element to include a magnetization free layer having a variable magnetization direction and an easy magnetization axis in a first direction, a magnetization pinned layer having a magnetization that is pinned in the first direction, and a reference layer between the magnetization free layer and the magnetization pinned layer to have a magnetization angle inclined from an initial direction due to a magnetic exchange coupling between the reference layer and the magnetization pinned layer; and structuring the reference layer, the magnetization pinned layer and the magnetic exchange coupling to increase a spin transfer torque (STT) efficiency and to reduce a current to flow through the magnetization free layer in switching the variable magnetization direction between being parallel to the first direction and being opposite to the first direction.

Implementations of the above electronic device may include one or more the following.

The STT efficiency may be increased by controlling the relative angle between the magnetization direction of the magnetization free layer and the magnetization direction of the reference layer. The method may further comprise: structuring the reference layer and the magnetization pinned layer to be ferromagnetically coupled. The method may further comprise: structuring the reference layer and the magnetization pinned layer to be anti-ferromagnetically coupled. The method may further comprise: providing a non-magnetic layer between the reference layer and the magnetization pinned layer; and controlling a thickness of the non-magnetic layer to control the magnetic exchange coupling between the reference layer and the magnetization pinned layer.

These and other aspects, implementations and associated advantages are described in greater detail in the drawings, the description and the claims.

BRIEF DESCRIPTION OF THE DRAWINGS

FIGS. 8A to 8D is cross-sectional views showing examples of an electronic device.

DETAILED DESCRIPTION

Figure 1:
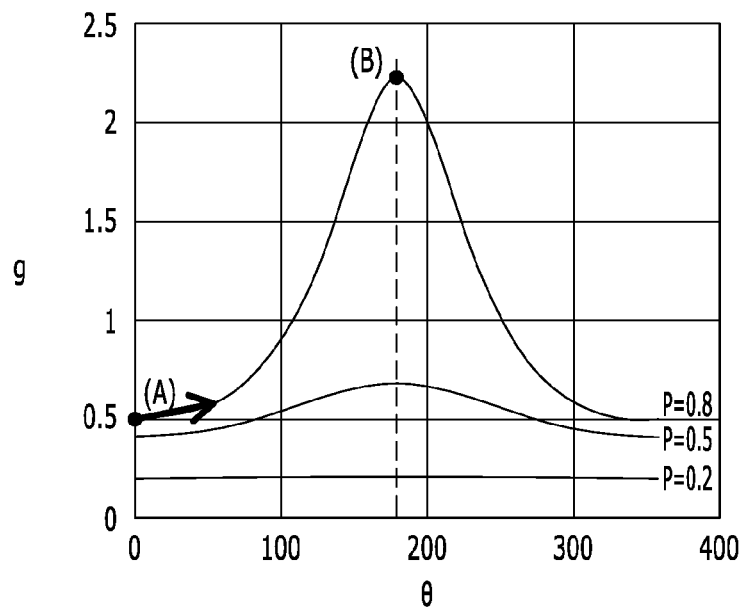
FIG. 1 is a graph showing STT efficiency 'g' as a function of a relative angle θ between a magnetization direction of a magnetization pinned layer and a magnetization direction of a magnetization free layer.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a graph showing STT efficiency 'g' as a function of a relative angle θ between a magnetization direction of a magnetization pinned layer and a magnetization direction of a magnetization free layer.

Referring to FIG. 1, a variable resistance element can switch its resistance between at least two different resistance states due to a change of its electrical resistance in response to a voltage or current applied to the variable resistance element. The variable resistance element can be implemented in form of a magnetic tunnel junction (MTJ) element including a magnetization pinned layer having a pinned magnetization direction and a magnetization free layer having a variable magnetization direction.

The MTJ element may have a varying electrical resistance depending on a magnetization direction of the magnetization free layer. For example, the MTJ element may be in a low resistance state having a low resistance when the magnetization pinned layer and the magnetization free layer have parallel magnetization directions and may be in a high resistance state having a high resistance when the magnetization pinned layer and the magnetization free layer have anti-parallel magnetization directions. The magnetization direction of the magnetization free layer may be changed by the spin transfer torque (STT) via injection of a current having spin-polarized carriers such as electrons or an applied magnetic field.

The current amount supplied to the MTJ element through a transistor tends to be limited. In particular, when the current having a specific value or higher than a specific threshold value flows through the MTJ element, insulation breakdown may occur. In the case of an STT-based MTJ device, it is desirable or necessary to reduce the amount of a switching current for changing the magnetization direction of the magnetization free layer. To this end, the STT efficiency g can be represented by $g(\theta)=P1/(1+P1*P2*\cos\theta)$ where reference numeral 'θ' is a relative angle between the magnetization directions of the magnetization pinned layer and the magnetization free layer, and reference numerals 'P1' and 'P2' are the spin polarizations of the magnetization pinned layer and the magnetization free layer, respectively. The STT efficiency g can be improved by configuring the MTJ structure.

The STT efficiency 'g' varies depending on the relative angle θ between the magnetization directions of the magnetization pinned layer and the magnetization free layer, and the STT efficiency increases as the spin polarization P increases. For example, the STT efficiency 'g' is the smallest when the magnetization free layer and the magnetization pinned layer have the same magnetization direction (θ=0 degree or θ=360 degrees) and the greatest when the magnetization free layer and the magnetization pinned layer have opposite magnetization directions (θ=180 degrees). That is, STT efficiency 'g' is relatively lower in the state (A) in which the magnetization pinned layer and the magnetization free layer have parallel magnetization directions than the STT efficiency 'g' in the state (B) in which the magnetization pinned layer and the magnetization free layer have anti-parallel magnetization directions. Accordingly, the current for changing the state (A) in which the magnetization pinned layer and the magnetization free layer have parallel magnetization directions into the state (B) in which the magnetization pinned layer and the magnetization free layer have anti-parallel magnetization directions is greater than current for changing the state (B) in which the magnetization pinned layer and the magnetization free layer have anti-parallel magnetization directions (B) into the state (A) in which the magnetization pinned layer and the magnetization free layer have anti-parallel magnetization directions.

A switching current of the MTJ element is set to a value on which the magnetization direction of the magnetization free layer can be changed irrespective of a relative angle θ between the magnetization directions of the magnetization pinned layer and the magnetization free layer. In order to reduce the magnitude the switching current of the MTJ element, it is desirable to reduce the maximum current for effectuating the switching which is the current for changing the state (A) in which the magnetization pinned layer and the magnetization free layer have parallel magnetization directions into the state (B) in which the magnetization pinned layer and the magnetization free layer have anti-parallel magnetization directions.

Figure 2:
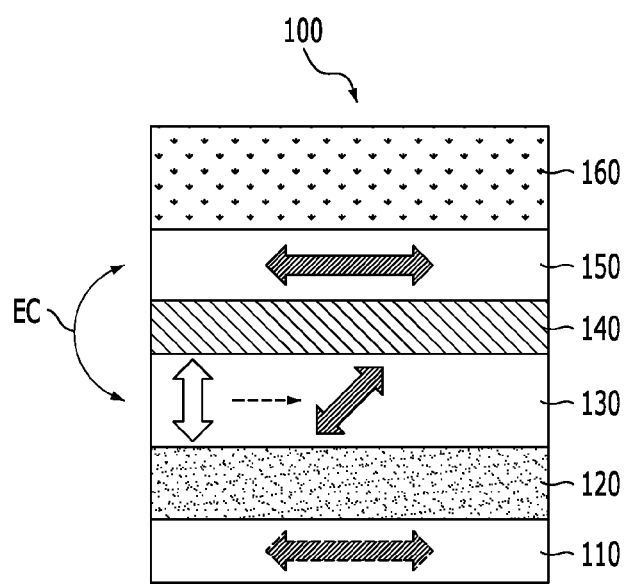
FIG. 2 is a cross-sectional view of a semiconductor device.

FIG. 2 is a cross-sectional view of a variable resistance element 100 in an electronic device in accordance with a first implementation of this patent document.

Referring to FIG. 2, the variable resistance element 100 includes a first magnetic layer 110, a second magnetic layer 130 and a third magnetic layer 150. The first magnetic layer 110 is a magnetization free layer having a variable magnetization direction and is configured to have an easy magnetization axis in a first direction where the variable magnetization direction can be switched be along or opposite to the first direction. The third magnetic layer 150 is configured to have a magnetization direction pinned in the first direction. The second magnetic layer 130 is interposed between the first magnetic layer 110 and the third magnetic layer 150 have a magnetization direction pinned in a second direction different from the first direction. A tunnel barrier layer 120 is interposed between the first magnetic layer 110 and the second magnetic layer 130. A non-magnetic layer 140 may be interposed between the second magnetic layer 130 and the third magnetic layer 150. On the other side of the third magnetic layer 150, an anti-ferromagnetic layer 160 is formed in contact with the third magnetic layer 150 on the opposite side of the non-magnetic layer 140.

As illustrated in the specific example of FIG. 2, the first direction of the easy magnetization axis of the first magnetic layer 110 may be in a direction along a surface of the layer. The second direction for the pinned magnetization direction of the second magnetic layer 130 may be inclined at an angle of greater than 0 degree and less than 90 degrees with respect to the layer surface, i.e., an angle between a direction vertical to the surface of the layer and a direction horizontal to the surface of the layer. In FIG. 2, the second direction may be a direction that is inclined from an upward direction or downward direction to the left direction or the right direction. That is, the second direction may be a direction that is inclined at an angle of greater than 0 degree to less than 90 degrees, an angle of greater than 90 degrees and less than 180 degrees, an angle of greater than 180 degrees and less than 270 degrees, or an angle of greater than 270 degrees and less than 360 degrees from the first direction.

The first magnetic layer 110 and the third magnetic layer 150 may include ferromagnetic materials, such as iron (Fe), nickel (Ni), cobalt (Co), gadolinium (Gd), or dysprosium (Dy), or an alloy thereof, such as cobalt-iron (CoFe), nickel-iron (NiFe), or cobalt-iron-nickel (CoFeNi). In order to improve the physical properties of the first and the third magnetic layers 110 and 150, various elements may be added to such ferromagnetic materials and the alloys thereof. For example, each of the first and the third magnetic layers 110 and 150 may be a single layer including cobalt-iron-boron (CoFeB) in which boron (B) is added to cobalt-iron (CoFe), cobalt-iron-boron-tantalum (CoFeBTa) in which tantalum (Ta) is added to cobalt-iron-boron (CoFeB), or cobalt-iron-boron-silicon (CoFeBSi) in which silicon (Si) is added to cobalt-iron-boron (CoFeB), or a multiple layer including a combination of them. Furthermore, the first magnetic layer 110 and the third magnetic layer 150 may be made of the same materials or different materials. The first magnetic layer 110 may function as a magnetization free layer having a variable magnetization direction and may be magnetized parallel or anti-parallel to the magnetization direction of the third magnetic layer 150 that serves as a magnetization pinned layer.

The second magnetic layer 130 may include ferromagnetic materials, such as iron (Fe), nickel (Ni), cobalt (Co), gadolinium (Gd), or dysprosium (Dy), or an alloy, such as cobalt-iron (CoFe), nickel-iron (NiFe), cobalt-iron-nickel (CoFeNi), cobalt-platinum (CoPt), cobalt-palladium (CoPd), iron-platinum (FePt), or iron-palladium (FePd), that is, an alloy of the ferromagnetic materials and a platinum group element, such as platinum (Pt) or palladium (Pd). In order to improve the physical properties of the second magnetic layer 130, various elements may be added to the ferromagnetic materials and the alloys thereof. For example, the second magnetic layer 130 may be a single layer including cobalt-iron-boron-tantalum (CoFeBTa) or cobalt-iron-boron-silicon (CoFeBSi) in which tantalum (Ta) or silicon (Si) is further added to cobalt-iron-boron (CoFeB), cobalt-platinum-boron (CoPtB), cobalt-palladium-boron (CoPdB), iron-platinum-boron (FePtB), iron-palladium-boron (FePdB), or cobalt-iron-boron (CoFeB) in which boron (B) is added to cobalt-iron (CoFe), cobalt-platinum (CoPt), cobalt-palladium (CoPd), iron-platinum (FePt), or iron-palladium (FePd), or a multiple layer including a combination of them. Furthermore, the second magnetic layer 130 may be made of the same materials as or different materials from the first and the third magnetic layers 110 and 150. The second magnetic layer 130 may function as a reference layer that is initially magnetized in a direction vertical or perpendicular to the second magnetic layer 130 or the intra-layer direction.

The tunnel bather layer 120 may be formed by depositing non-magnetic insulating materials, such as magnesium oxide (MgO), aluminum oxide ($Al_2O_3$), silicon oxide ($SiO_2$), bismuth oxide ($Bi_2O_3$), magnesium nitride (MgN), aluminum nitride (AlN), silicon nitride (SiN), magnesium fluoride ($MgF_2$), or calcium fluoride ($CaF_2$), using, e.g., a radio frequency (RF) sputtering method or a pulsed direct current (DC) sputtering method. In an implementation, the tunnel barrier layer 120 may be formed by, e.g., first depositing metal, such as magnesium (Mg), aluminum (Al), titanium (Ti), tantalum (Ta), or hafnium (Hf), and then oxidizing the deposited metal. The tunnel barrier layer 120 may have a thickness that is sufficiently thin to the extent that allows a tunneling magnetoresistance (TMR) phenomenon to occur.

The non-magnetic layer 140, the second and the third magnetic layers 130 and 150 can effectuate a magnetization pinned layer having a synthetic anti-ferromagnetic (SAF) layer. The second and the third magnetic layers 130 and 150 may be subject to magnetically exchange coupling (EC) with the non-magnetic layer 140 interposed therebetween. The non-magnetic layer 140 may include non-magnetic conductive materials, such as ruthenium (Ru), chrome (Cr), copper (Cu), titanium (Ti), tungsten (W), or tantalum (Ta). Characteristics such as the strength of EC between the second and the third magnetic layers 130 and 150 and an aspect between the second and the third magnetic layers 130 and 150 may be controlled by controlling the thickness of the non-magnetic layer 140. In particular, when the second and the third magnetic layers 130 and 150 are ferromagnetically coupled, the magnetization direction of the second magnetic layer 130 may be inclined from an initial vertical direction to the same magnetization direction of the third magnetic layer 150. When the second and the third magnetic layers 130 and 150 are anti-ferromagnetically coupled, the magnetization direction of the second magnetic layer 130 may be inclined from an initial vertical direction to the opposite magnetization direction of the third magnetic layer 150. Here, an angle at which the magnetization direction of the second magnetic layer 130 is inclined increases as the strength of EC between the second and the third magnetic layers 130 and 150 increases.

Referring back to FIG. 1, when the magnetization direction of the second magnetic layer 130 is inclined, a relative angle θ between the magnetization directions of the first magnetic layer 110 and the second magnetic layer 130 is changed. As a result, STT efficiency 'g' may increase in the state in which the magnetization directions of the first magnetic layer 110 and the second magnetic layer 130 are parallel to each other. For example, assuming that the spin polarization of each of the first magnetic layer 110 and the second magnetic layer 130 is 0.8, the STT efficiency under the condition that the magnetization direction of the second magnetic layer 130 is inclined to form a relative angle of 60 degrees between the magnetization directions of the first magnetic layer 110 and the second magnetic layer 130 is 'g(60)=0.8/(1+0.8×0.8×cos 60)≈0.61.' In comparison, the STT efficiency is 0.49 (g(0)= 0.8/(1+0.8×0.8×cos 0)≈0.49) when the magnetization direction of the second magnetic layer 130 is not inclined and forms a relative angle of 0 degree between the magnetization directions of the first magnetic layer 110 and the second magnetic layer 130. Therefore, STT efficiency is increased by about 12% by increasing the relative angle θ from 0 to 60 degrees. Accordingly, the switching current for changing the magnetization direction of the first magnetic layer 110 may be reduced by increasing the STT efficiency 'g' by properly engineering the synthetic anti-ferromagnetic (SAF) layer formed by the layers 130, 140 and 150 as described above.

The anti-ferromagnetic layer 160 serves to stably fix the magnetization direction of the third magnetic layer 150. The anti-ferromagnetic layer 160 may include anti-ferromagnetic materials, such as platinum-manganese (PtMn), iridium-manganese (IrMn), nickel-manganese (NiMn), iron-manganese (FeMn), nickel oxide (NiO), cobalt oxide (CoO), iron oxide ($Fe_2O_3$), nickel chloride ($NiCl_2$), cobalt chloride ($CoCl_2$), or iron chloride ($FeCl_2$).

FIGS. 3A to 3H are cross-sectional views illustrating magnetization directions of magnetic layers that form the semiconductor element in FIG. 2 for an electronic device in accordance with the first implementation of this patent document.

Figure 3A:
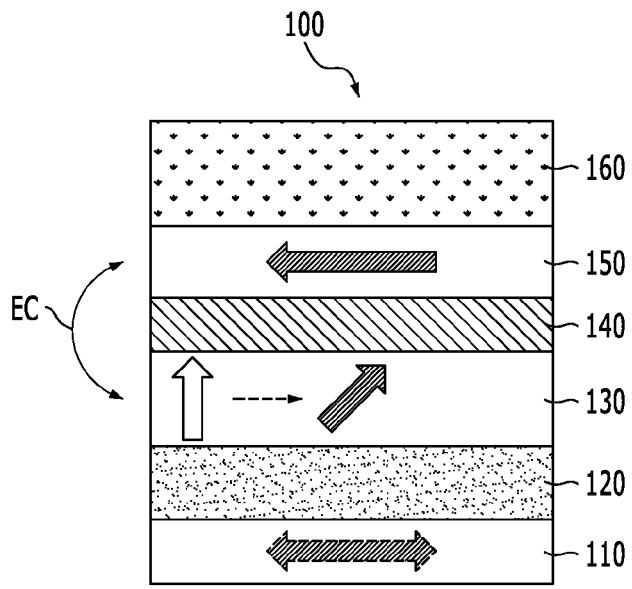
FIGS. 3A to 3H are cross-sectional views illustrating magnetization directions of magnetic layers that form an electronic device.

Referring to FIG. 3A, an initial magnetization direction of the second magnetic layer 130 may be an upward direction, and the third magnetic layer 150 may have a magnetization direction pinned in the left direction. Here, if the second magnetic layer 130 and the third magnetic layer 150 are subject to EC anti-ferromagnetically, the magnetization direction of the second magnetic layer 130 may be inclined at an angle of greater than 0 degree and less than 90 degrees from the initial upward direction towards a direction opposite to the magnetization direction of the third magnetic layer 150, that is, in the right direction.

Figure 3B:
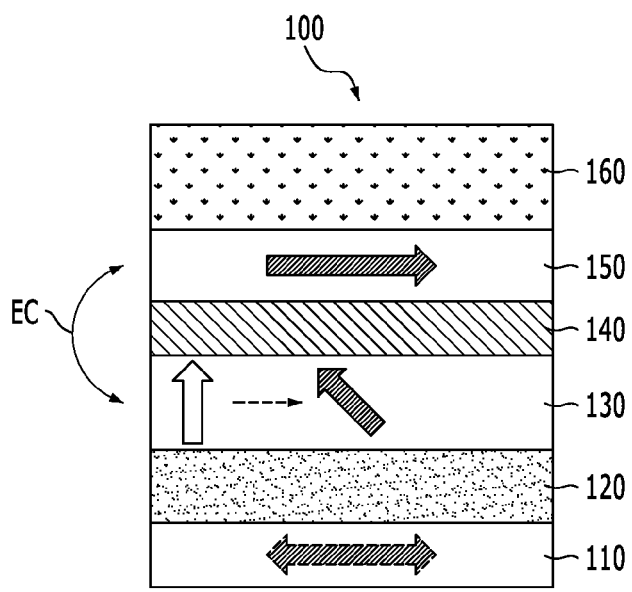

Referring to FIG. 3B, an initial magnetization direction of the second magnetic layer 130 may be in an upward direction, and the third magnetic layer 150 may have a magnetization direction pinned in the right direction. Here, if the second magnetic layer 130 and the third magnetic layer 150 are subject to EC anti-ferromagnetically, the magnetization direction of the second magnetic layer 130 may be inclined at an angle of greater than 0 degree and less than 90 degrees from the initial upward direction to a direction opposite to the magnetization direction of the third magnetic layer 150, that is, in the left direction.

Figure 3C:
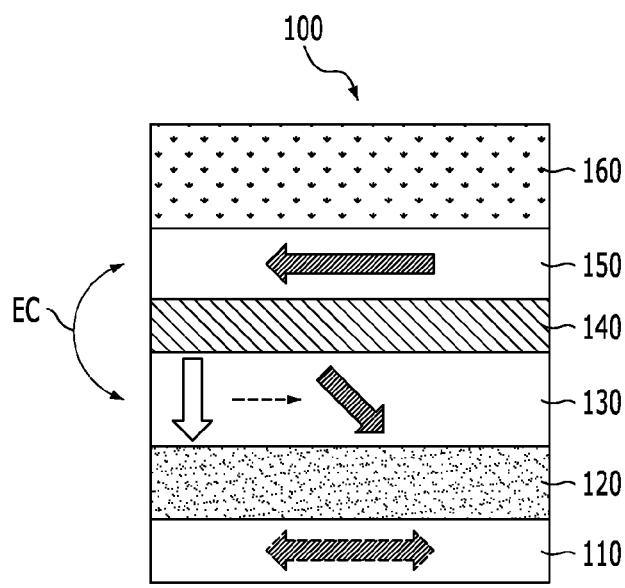

Referring to FIG. 3C, an initial magnetization direction of the second magnetic layer 130 may be in a downward direction, and the third magnetic layer 150 may have a magnetization direction pinned in the left direction. Here, if the second magnetic layer 130 and the third magnetic layer 150 are subject to EC anti-ferromagnetically, the magnetization direction of the second magnetic layer 130 may be inclined at an angle of greater than 0 degree and less than 90 degrees from the initial downward direction to a direction opposite to the magnetization direction of the third magnetic layer 150, that is, in the right direction.

Figure 3D:
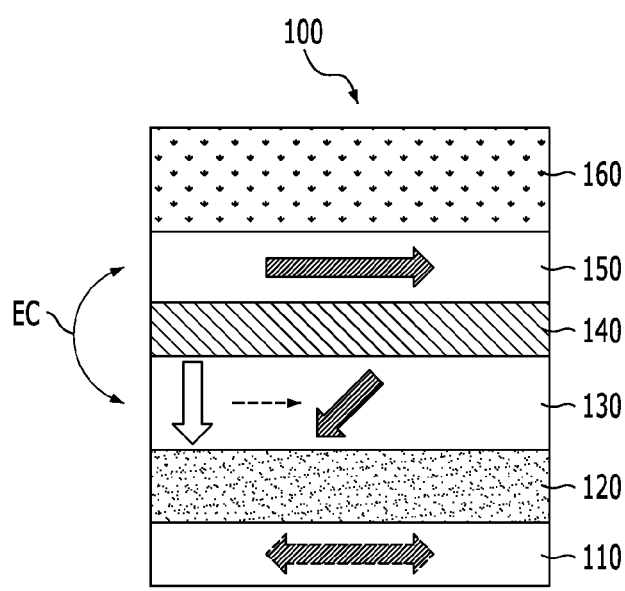

Referring to FIG. 3D, an initial magnetization direction of the second magnetic layer 130 may be in a downward direction, and the third magnetic layer 150 may have a magnetization direction pinned in the right direction. Here, if the second magnetic layer 130 and the third magnetic layer 150 are subject to EC anti-ferromagnetically, the magnetization direction of the second magnetic layer 130 may be inclined at an angle of greater than 0 degree and less than 90 degrees from the initial downward direction to a direction opposite to the magnetization direction of the third magnetic layer 150, that is, in the left direction.

Figure 3E:
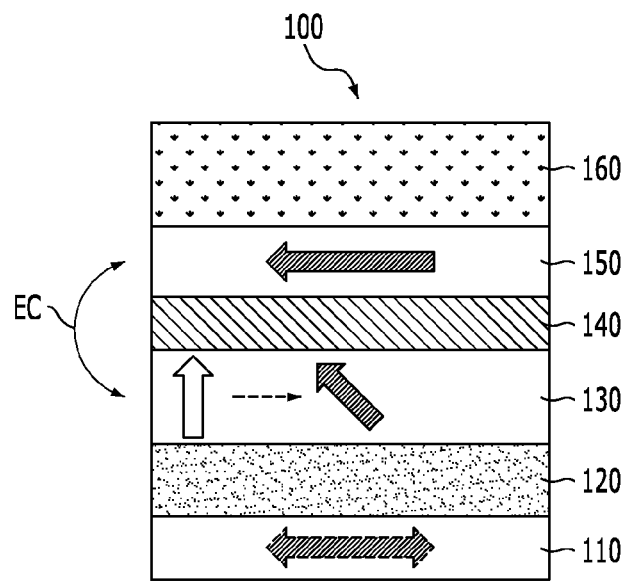

Referring to FIG. 3E, an initial magnetization direction of the second magnetic layer 130 may be an upward direction, and the third magnetic layer 150 may have a magnetization direction pinned in the left direction. Here, if the second magnetic layer 130 and the third magnetic layer 150 are subject to EC ferromagnetically, the magnetization direction of the second magnetic layer 130 may be inclined at an angle of greater than 0 degree and less than 90 degrees from the initial upward direction to the magnetization direction of the third magnetic layer 150, that is, in the left direction.

Figure 3F:
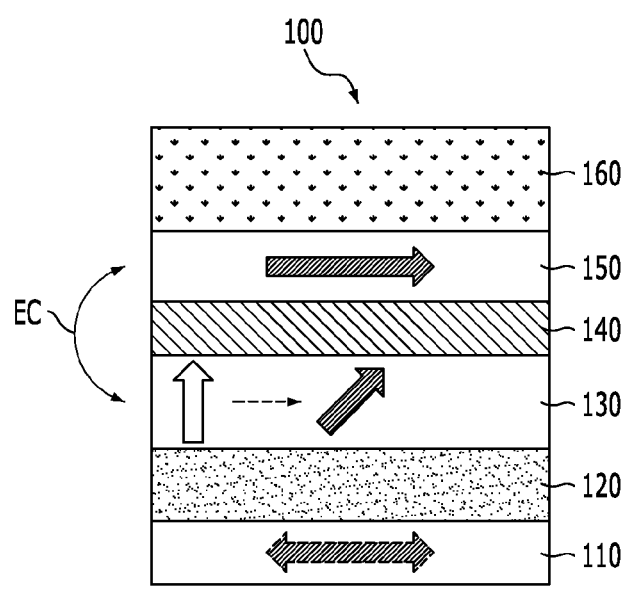

Referring to FIG. 3F, an initial magnetization direction of the second magnetic layer 130 may be an upward direction, and the third magnetic layer 150 may have a magnetization direction pinned in the right direction. Here, if the second magnetic layer 130 and the third magnetic layer 150 are subject to EC ferromagnetically, the magnetization direction of the second magnetic layer 130 may be inclined at an angle of greater than 0 degree to less than 90 degrees from the initial upward direction to the magnetization direction of the third magnetic layer 150, that is, in the right direction.

Figure 3G:
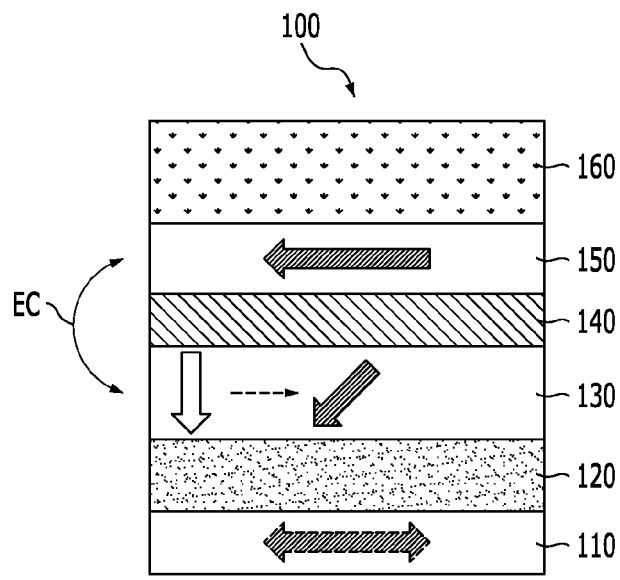

Referring to FIG. 3G, an initial magnetization direction of the second magnetic layer 130 may be a downward direction, and the third magnetic layer 150 may have a magnetization direction pinned in the left direction. Here, if the second magnetic layer 130 and the third magnetic layer 150 are subject to EC ferromagnetically, the magnetization direction of the second magnetic layer 130 may be inclined at an angle of greater than 0 degree and less than 90 degrees from the initial downward direction to the magnetization direction of the third magnetic layer 150, that is, in the left direction.

Figure 3H:
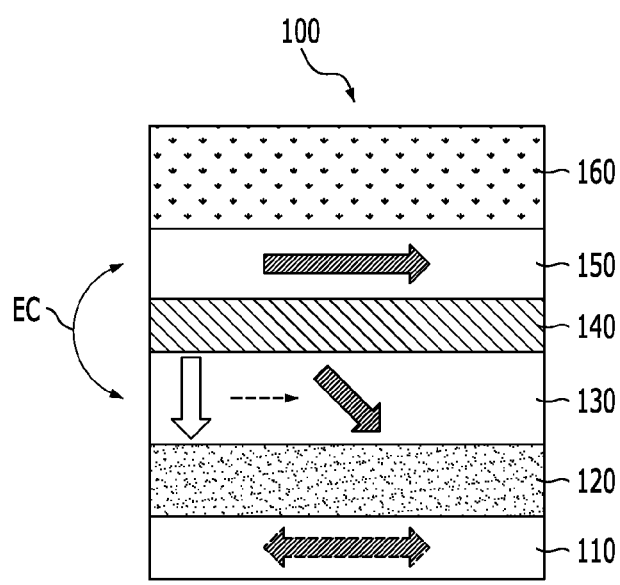

Referring to FIG. 3H, an initial magnetization direction of the second magnetic layer 130 may be a downward direction, and the third magnetic layer 150 may have a magnetization direction pinned in the right direction. Here, if the second magnetic layer 130 and the third magnetic layer 150 are subject to EC ferromagnetically, the magnetization direction of the second magnetic layer 130 may be inclined at an angle of greater than 0 degree and less than 90 degrees from the initial downward direction to the magnetization direction of the third magnetic layer 150, that is, in the right direction.

FIGS. 4 to 7 are cross-sectional views of electronic devices in accordance with second to fifth implementations of this patent document.

Figure 4:
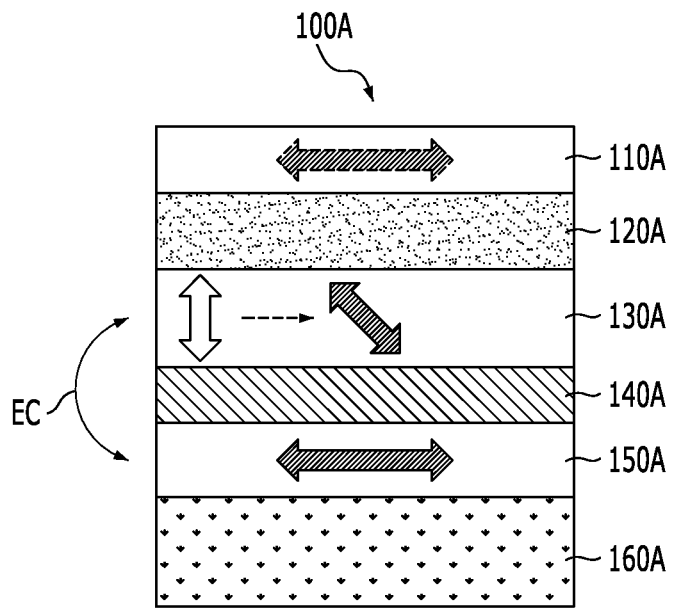
FIGS. 4 to 7 are cross-sectional views of electronic devices in various implementations.

Referring to FIG. 4, a variable resistance element 100A that forms part of an electronic device in accordance with the second implementation of this patent document. The variable resistance element 100A includes first, second and third magnetic layers 110A, 130A and 150A arranged in a reverse order from the variable resistance element 100 in FIG. 2. The third magnetic layer 150A is placed on an anti-ferromagnetic layer 160A and is configured to have a magnetization direction pinned in a first direction. A non-magnetic layer 140A is placed on the third magnetic layer 150A. The second magnetic layer 130A is placed on the non-magnetic layer 140A and is configured to have a magnetization direction pinned in a second direction different from the first direction. A tunnel barrier layer 120A is placed on the second magnetic layer 130A. The first magnetic layer 110A is placed on the tunnel barrier layer 120A and is configured to have a magnetization direction varied in the first direction.

Figure 5:
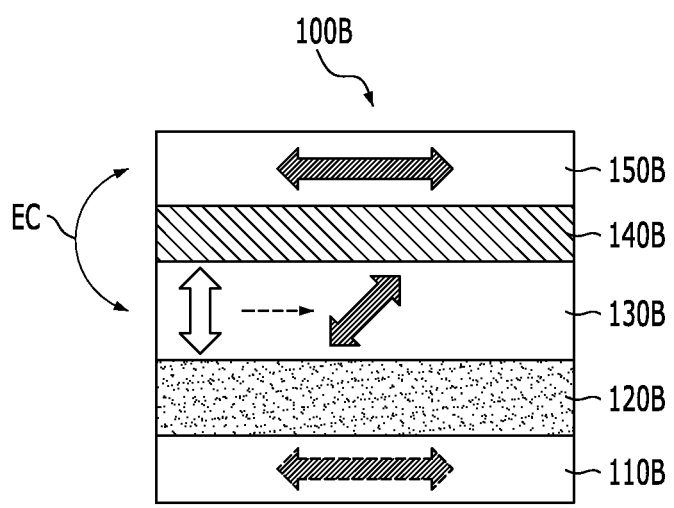

Referring to FIG. 5, a variable resistance element 100B that forms a part of an electronic device in accordance with the third implementation of this patent document is provided to include three magnetic layers: first, second and third magnetic layers 110B, 130B and 150B. The first magnetic layer 110B is configured to have a magnetization direction in a first direction which varies to be along or opposite to an easy magnetization axis. The third magnetic layer 150B is configured to have a magnetization direction pinned in the first direction. The second magnetic layer 130B is interposed between the first magnetic layer 110B and the third magnetic layer 150B and is configured to have a magnetization direction pinned in a second direction different from the first direction. A tunnel barrier layer 120B is interposed between the first magnetic layer 110B and the second magnetic layer 130B. A non-magnetic layer 140B is interposed between the second magnetic layer 130B and the third magnetic layer 150B. Different from the variable resistance elements in FIGS. 2 and 4, the variable resistance element 100B in FIG. 5 is free of an anti-ferromagnetic layer on the third magnetic layer 150B with a pinned magnetization.

Figure 6:
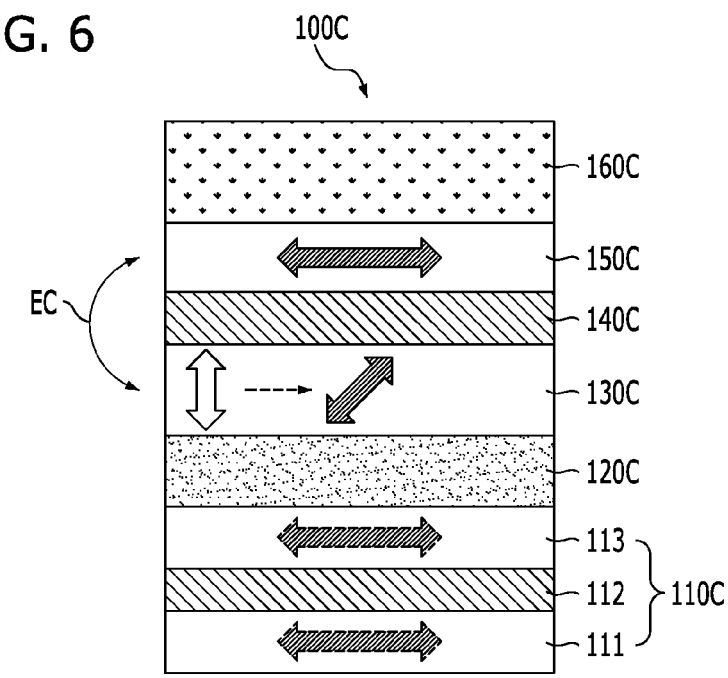

Referring to FIG. 6, a first magnetic layer 110C of a variable resistance element 100C that forms a part of the electronic device in accordance with the fourth implementation of this patent document is provided to include a first magnetic layer 110C, a second magnetic layer 130C and a third magnetic layer 150C in a structure similar to the structure in FIG. 2. However, the first magnetic layer 110C is a composite layer having a lower magnetic layer 111, an upper magnetic layer 113, and a non-magnetic layer 112 interposed between the lower magnetic layer 111 and the upper magnetic layer 113. The lower magnetic layer 111 and the upper magnetic layer 113 may be magnetically coupled with the non-magnetic layer 112 interposed therebetween. The lower magnetic layer 111, the non-magnetic layer 112, and the upper magnetic layer 113 may form a magnetization free layer having an SAF layer structure. The lower magnetic layer 111 and the upper magnetic layer 113 may include ferromagnetic materials or the alloy thereof, and the non-magnetic layer 112 may include non-magnetic conductive materials.

Figure 7:
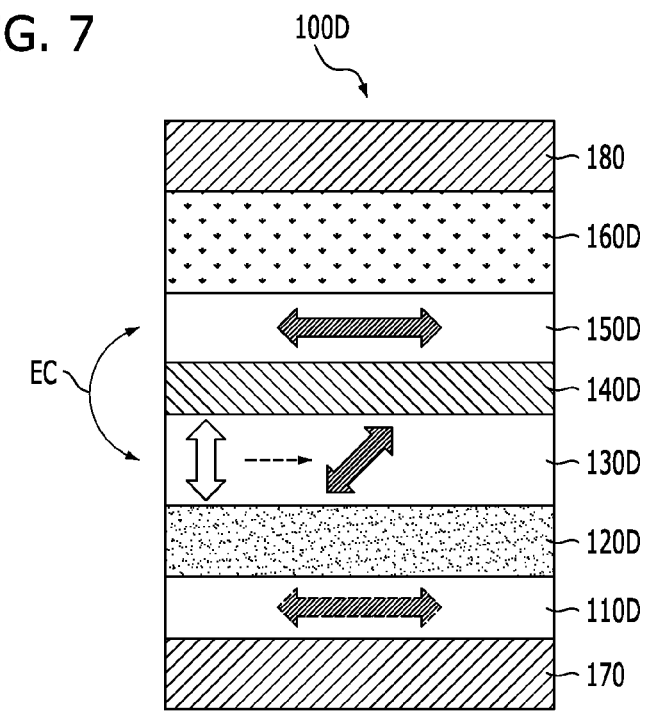

Referring to FIG. 7, a variable resistance element 100D that forms part of an electronic device in accordance with the fifth implementation of this patent document is provided. A first conductive layer 170 may be coupled with a first magnetic layer 110D. A second conductive layer 180 may be coupled with a third magnetic layer 150D through an anti-ferromagnetic layer 160D. The first conductive layer 170 may be a seed layer for forming upper structures, such as the first magnetic layer 110D, and the second conductive layer 180 may be a capping layer for protecting underlying structures, such as the anti-ferromagnetic layer 160D. The first and the second conductive layers 170 and 180 may include conductive materials capable of applying a voltage or current to the variable resistance element 100D. For example, each of the first and the second conductive layers 170 and 180 may be a single layer including metal, such as tantalum (Ta), titanium (Ti), ruthenium (Ru), hafnium (Hf), zirconium (Zr), aluminum (Al), tungsten (W), copper (Cu), aurum (Au), silver (Ag), platinum (Pt), nickel (Ni), chrome (Cr), or cobalt (Co), or metal nitride, such as titanium nitride (TiN), tantalum nitride (TaN), or tungsten nitride (WN), or a multiple layer including a combination of them.

FIGS. 8A to 8D are cross-sectional views showing examples of an electronic device in accordance with implementations of this patent document.

Referring to FIG. 8A, an electronic device that implements a variable resistance element 100 is provided. This electronic device includes a first electrode 200, a second electrode 300 spaced apart from the first electrode 200, and a variable resistance element 100 interposed between the first electrode 200 and the second electrode 300. The first electrode 200 may be electrically coupled with a transistor, and the second electrode 300 may be coupled with a bit line 660.

The transistor is used as a switch that performs an on or off operation and may be an N-channel metal oxide semiconductor (NMOS) transistor or a P-channel metal oxide semiconductor (PMOS) transistor. The transistor may include a gate electrode 610 formed over a substrate 600. A source region 620S and a drain region 620D are formed in the substrate 600 on two sides of the gate electrode 610. A gate insulating layer (not shown) may be interposed between the substrate 600 and the gate electrode 610. The source region 620S may be coupled with a source line 650 through a contact plug 630, and the drain region 620D may be coupled with the first electrode 200 through a contact plug 640.

The substrate 600 may be a silicon (Si) substrate, a germanium (Ge) substrate, a silicon-germanium (SiGe) substrate, or a silicon-on-insulator (SOI) substrate, and the source region 620S and the drain region 620D may be formed by injecting impurities into the substrate 600 through an ion implantation process. Furthermore, the gate electrode 610, the contact plugs 630 and 640, the source line 650, and the bit line 660 may include conductive materials, such as metal, metal nitride, or doped silicon.

Figure 8B:
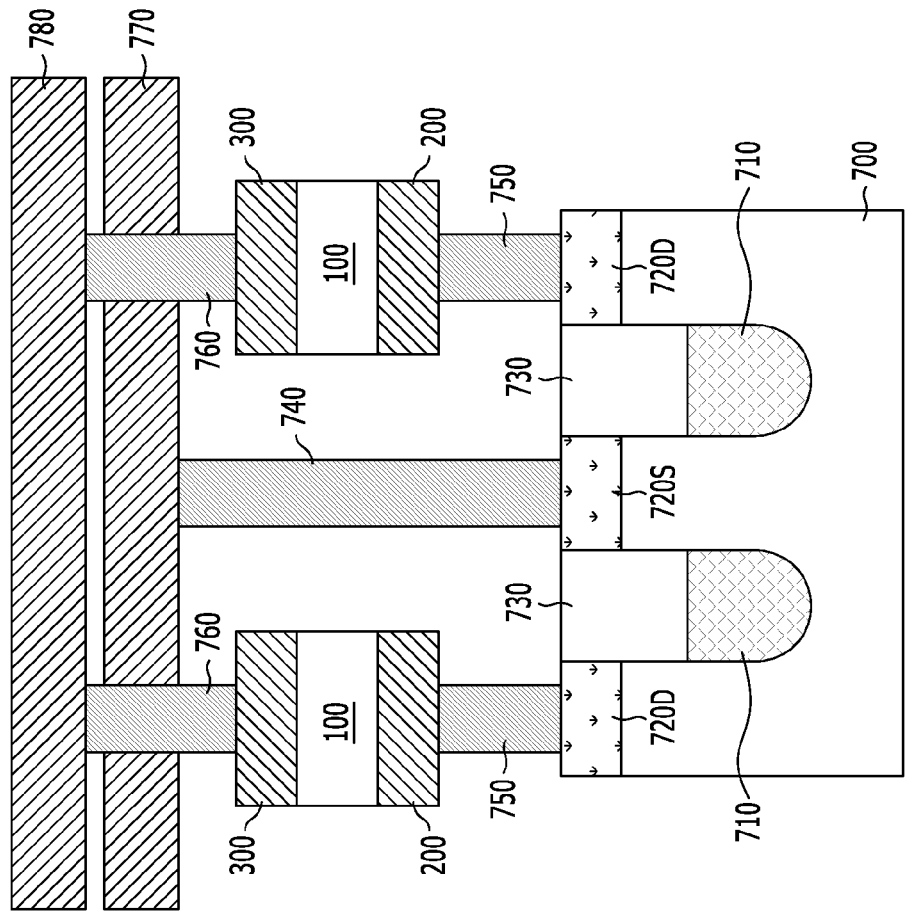

Referring to FIG. 8B, another exemplary electronic device having two or more variable resistance elements 100 is shown. Each variable resistance element 100 is placed between electrodes 200 and 300. The first electrode 200 of the electronic device may be electrically coupled with a transistor having a gate electrode 710 buried in a substrate 700. The second electrode 300 may be coupled with a bit line 780 through a contact plug 760. A capping layer 730 may be formed over the gate electrode 710. A source region 720S or a drain region 720D into which impurities have been implanted may be formed in the substrate 700 on both sides of the capping layer 730. The source region 720S may be coupled with a source line 770 through a contact plug 740, and the drain region 720D may be coupled with the first electrode 200 through a contact plug 750.

The substrate 700 may be a semiconductor substrate including silicon or germanium, and a gate insulating layer (not shown) may be interposed between the substrate 700 and the gate electrode 710. Furthermore, the capping layer 730 may include materials based on an oxide layer or a nitride layer. The gate electrode 710, the contact plugs 740, 750, and 760, the source line 770, and the bit line 780 may include the aforementioned conductive materials.

Referring to FIG. 8C, another exemplary electronic device having two or more variable resistance elements 100 is shown. Each variable resistance element 100 is placed between electrodes 200 and 300. The first electrode 200 of the electronic device may be electrically coupled with a transistor in a configuration different from the transistors in FIGS. 8A and 8B. The transistor in FIG. 8C has a vertical channel layer 800. The second electrode 300 may be coupled with a bit line 830 through a contact plug 820. A gate electrode 810 may be in contact with at least part of the side of the vertical channel layer 800, and a gate insulating layer (not shown) may be interposed between the channel layer 800 and the gate electrode 810. The top of the vertical channel layer 800 may be coupled with the first electrode 200, and the bottom of the vertical channel layer 800 may be coupled with a source line 840.

The channel layer 800 may include semiconductor materials, such as silicon or germanium, and junctions (not shown) into which impurities have been implanted may be formed at the top and bottom of the channel layer 800. Furthermore, the gate electrode 810, the contact plug 820, the bit line 830, and the source line 840 may include the aforementioned conductive materials.

Referring to FIG. 8D, yet another exemplary electronic device having two or more variable resistance elements 100 is shown. Each variable resistance element 100 is placed between electrodes 200 and 300. The first electrode 200 of the electronic device may be electrically coupled with one end of a selection element 900 which can change its electrical conductivity states to turn on or off the electrical contact for the electrode 200. The second electrode 300 may be coupled with a bit line 920 through a contact plug 910. The other end of the selection element 900 may be coupled with a word line 930, and the bit line 920 and the word line 930 may be extended to cross each other.

The selection element 900 may be, for example, a diode, such as a Schottky diode, a PN diode, a PIN diode, or an MIM diode. In addition, the selection element 900 may include an asymmetrical tunnel barrier having a non-linear current-voltage characteristic, a metal-insulator transition (MIT) element whose electrical resistance is suddenly changed because the MIT element transits from an insulator to metal from metal to an insulator at a specific critical temperature, or an ovonic switching element that may switch at a specific threshold voltage. Furthermore, the contact plug 910, the bit line 920, and the word line 930 may include the aforementioned conductive materials.

The above and other memory circuits or semiconductor devices based on the disclosed technology may be used in a range of devices or systems. FIGS. 9-13 provide some examples of devices or systems that may implement the memory circuits disclosed herein.

Figure 9:
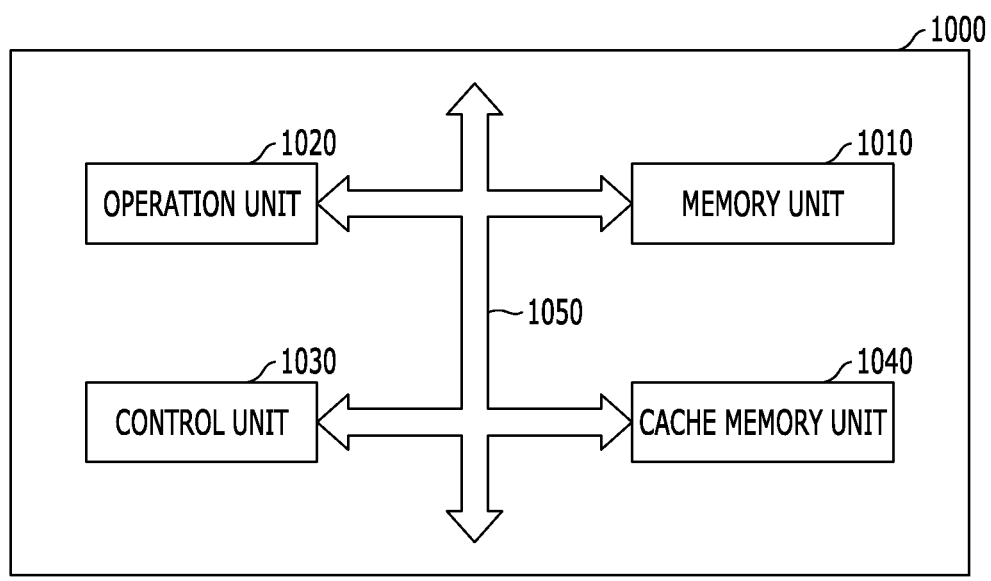
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described electronic devices in accordance with the implementations. For example, the memory unit 1010 may include a variable resistance element capable of storing data using a characteristic switched between different resistance states. The variable resistance element may include a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer. The variable resistance element may increase spin transfer torque (STT) efficiency by controlling a relative angle between a magnetization direction of the first magnetic layer and a magnetization direction of the second magnetic layer. Thus, the memory unit 1010 may reduce and minimize a switching current necessary to change the magnetization direction of the first magnetic layer, thereby reducing consumption power of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which may temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
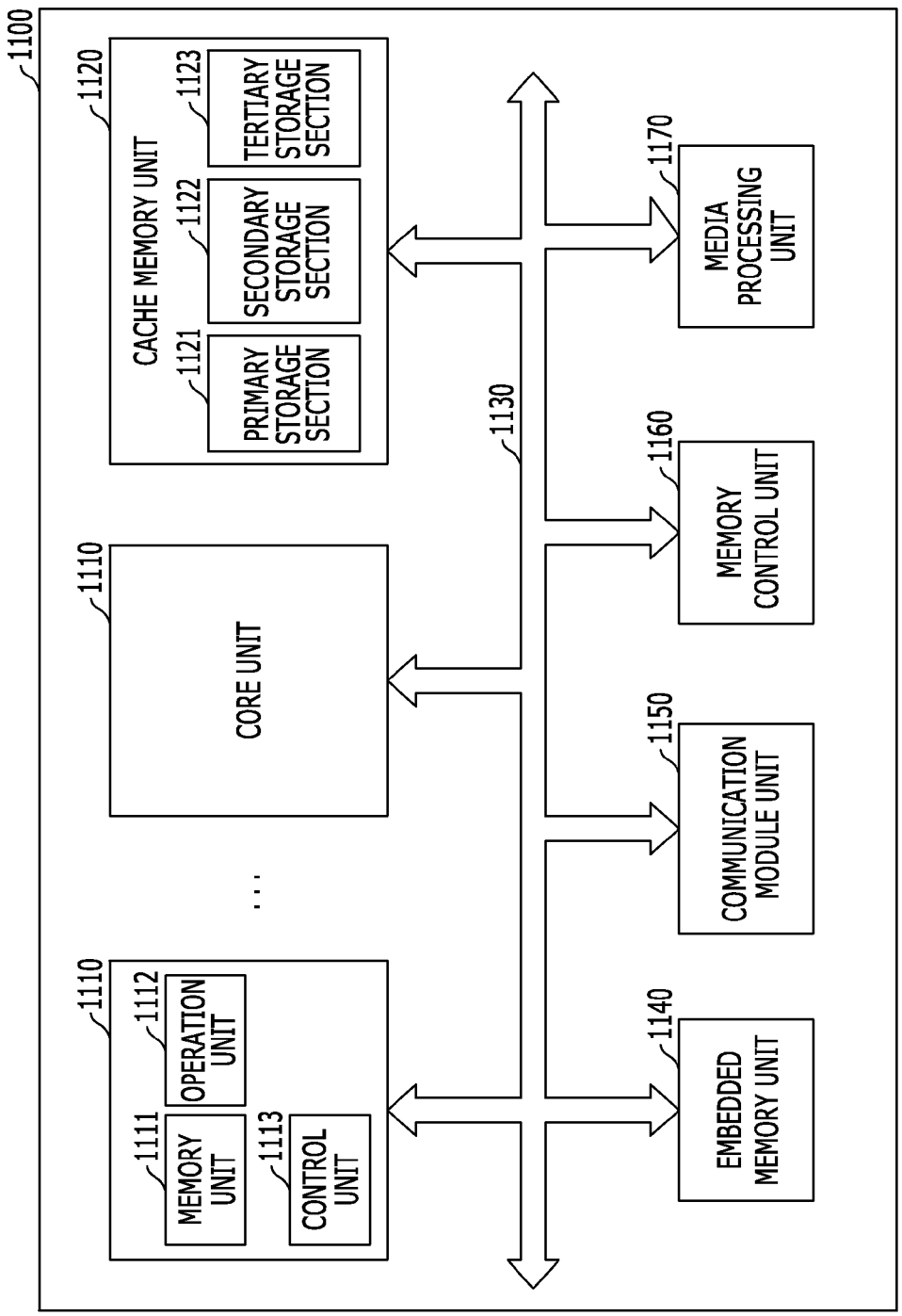
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

At least one storage section of the primary storage section 1121, the secondary storage section 1122 and the tertiary storage section 1123 of the cache memory unit 1120 may include one or more of the above-described electronic devices in accordance with the implementations. For example, the cache memory unit 1120 may include a variable resistance element capable of storing data using a characteristic switched between different resistance states. The variable resistance element may include a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer. The variable resistance element may increase spin transfer torque (STT) efficiency by controlling a relative angle between a magnetization direction of the first magnetic layer and a magnetization direction of the second magnetic layer. Through this, the cache memory unit 1120 can reduce and minimize a switching current necessary to change the magnetization direction of the first magnetic layer, thereby reducing consumption power of the processor 1100.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which may transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
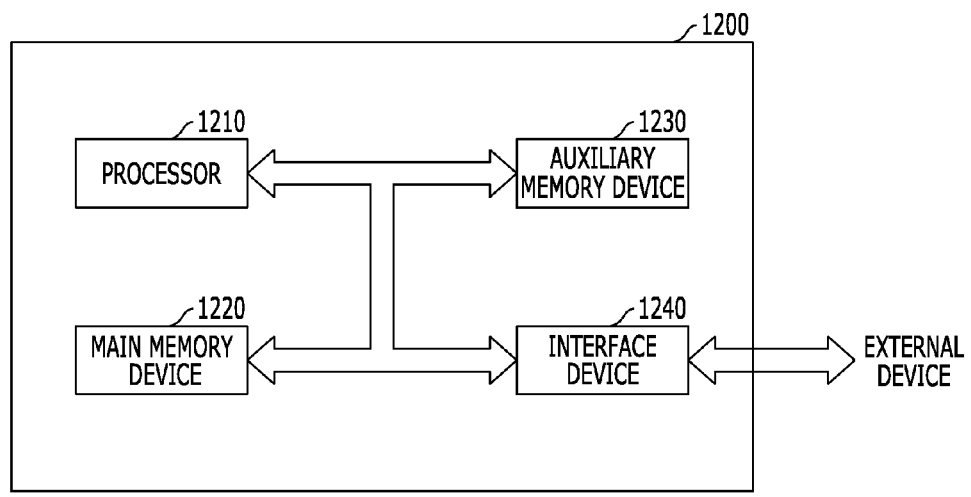
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and may conserve memorized contents even when power supply is cut off. The main memory device 1220 may include one or more of the above-described electronic devices in accordance with the implementations. For example, the main memory device 1220 may include a variable resistance element capable of storing data using a characteristic switched between different resistance states. The variable resistance element may include a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer. The variable resistance element may increase spin transfer torque (STT) efficiency by controlling a relative angle between a magnetization direction of the first magnetic layer and a magnetization direction of the second magnetic layer. Through this, the main memory device 1220 can reduce and minimize a switching current necessary to change the magnetization direction of the first magnetic layer, thereby reducing consumption power of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the electronic devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 may store a larger amount of data. The auxiliary memory device 1230 may include one or more of the above-described electronic devices in accordance with the implementations. For example, the auxiliary memory device 1230 may include a variable resistance element capable of storing data using a characteristic switched between different resistance states. The variable resistance element may include a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer. The variable resistance element may increase spin transfer torque (STT) efficiency by controlling a relative angle between a magnetization direction of the first magnetic layer and a magnetization direction of the second magnetic layer. Through this, the auxiliary memory device 1230 may reduce/minimize a switching current necessary to change the magnetization direction of the first magnetic layer, and consumption power of the system 1200 may be reduced.

Also, the auxiliary memory device 1230 may further include a data storage system such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the electronic devices according to the implementations, but may include data storage systems such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
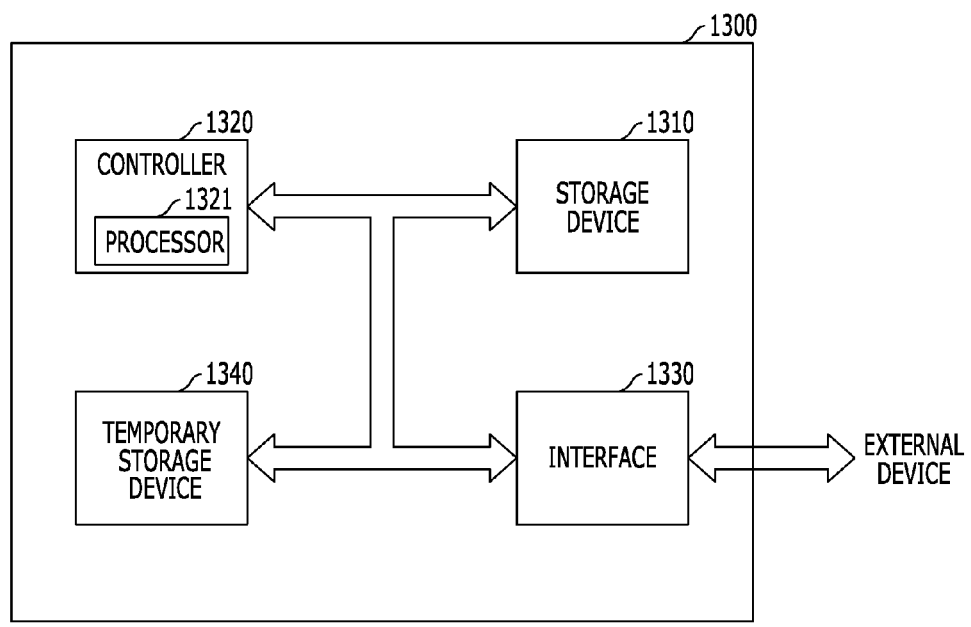
FIG. 12 is an example of configuration diagram of a data storage system implementing memory circuitry based on the disclosed technology.

FIG. 12 is an example of configuration diagram of a data storage system implementing memory circuitry based on the disclosed technology.

Referring to FIG. 12, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 may store data temporarily for efficiently transferring data between the interface 1330 and the storage device 1310 according to diversifications and high performance of an interface with an external device, a controller and a system.

Any of the storage device 1310 and the temporary storage device 1340 for temporarily storing data may include one or more of the above-described electronic devices in accordance with the implementations. The storage device 1310 or the temporary storage device 1340 may include a variable resistance element capable of storing data using a characteristic switched between different resistance states. The variable resistance element may include a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer. The variable resistance element may increase spin transfer torque (STT) efficiency by controlling a relative angle between a magnetization direction of the first magnetic layer and a magnetization direction of the second magnetic layer. Through this, the storage device 1310 or the temporary storage device 1340 may reduce/minimize a switching current necessary to change the magnetization direction of the first magnetic layer, and consumption power of the data storage system 1300 may be reduced.

Figure 13:
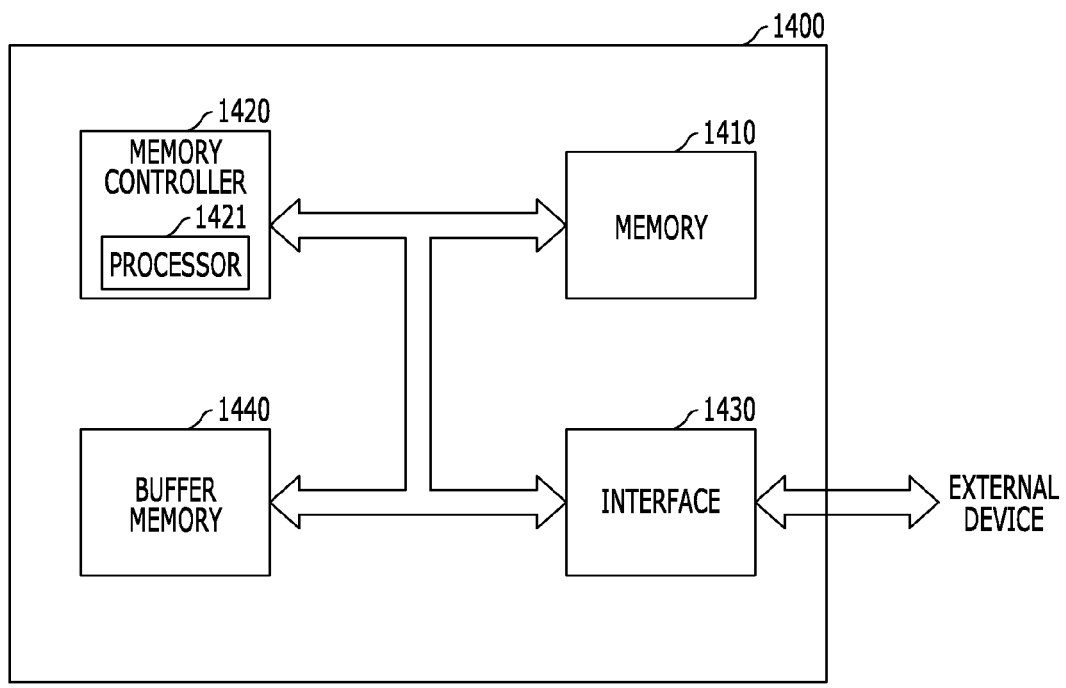
FIG. 13 is an example of configuration diagram of a memory system implementing memory circuitry based on the disclosed technology.

FIG. 13 is an example of configuration diagram of a memory system implementing memory circuitry based on the disclosed technology.

Referring to FIG. 13, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described electronic devices in accordance with the implementations. For example, the memory 1410 may include a variable resistance element capable of storing data using a characteristic switched between different resistance states. The variable resistance element may include a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer. The variable resistance element may increase spin transfer torque (STT) efficiency by controlling a relative angle between a magnetization direction of the first magnetic layer and a magnetization direction of the second magnetic layer. Through this, the memory 1410 may reduce/minimize a switching current necessary to change the magnetization direction of the first magnetic layer, and consumption power of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system.

For example, the buffer memory 1440 for temporarily storing data may include one or more of the above-described electronic devices in accordance with the implementations. The buffer memory 1440 may include may include a variable resistance element capable of storing data using a characteristic switched between different resistance states. The variable resistance element may include a first magnetic layer having an easy magnetization axis in a first direction and having a variable magnetization direction, a third magnetic layer having a magnetization direction pinned in the first direction, a second magnetic layer interposed between the first magnetic layer and the third magnetic layer, and having a magnetization direction pinned in a second direction different from the first direction, a tunnel barrier layer interposed between the first magnetic layer and the second magnetic layer, and a non-magnetic layer interposed between the second magnetic layer and the third magnetic layer. The variable resistance element may increase spin transfer torque (STT) efficiency by controlling a relative angle between a magnetization direction of the first magnetic layer and a magnetization direction of the second magnetic layer. Through this, the buffer memory 1440 may reduce/minimize a switching current necessary to change the magnetization direction of the first magnetic layer, and consumption power of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the electronic devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

In accordance with this technology, a switching current necessary to change the magnetization direction of a magnetization free layer may be reduced by improving STT efficiency through control of a relative angle between the magnetization directions of a magnetization pinned layer and the magnetization free layer.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations may be made based on what is described and illustrated in this patent document.

What is claimed is:

1. An electronic device comprising a semiconductor memory unit that includes:
   a first magnetic layer having an easy magnetization axis in a first direction and having a variable magnetization direction;

a third magnetic layer having a magnetization direction pinned in the first direction;

a second magnetic layer interposed between the first magnetic layer and the third magnetic layer and having a magnetization direction pinned in a second direction different from the first direction;

a tunnel barrier layer interposed between the first magnetic layer and the second magnetic layer; and a non-magnetic layer interposed between the second magnetic layer and the third magnetic layer, wherein the second direction is vertically inclined from a surface of the second magnetic layer.

2. The electronic device according to claim 1, wherein the second magnetic layer and the third magnetic layer are subject to magnetically exchange coupling.

3. The electronic device according to claim 2, wherein the second magnetic layer and the third magnetic layer are ferromagnetically coupled when the magnetization direction of the second magnetic layer is inclined toward a direction to the magnetization direction of the third magnetic layer.

4. The electronic device according to claim 2, wherein the second magnetic layer and the third magnetic layer are anti-ferromagnetically coupled when the magnetization direction of the second magnetic layer is inclined toward a direction opposite to the magnetization direction of the third magnetic layer.

5. The electronic device according to claim 1, wherein the first magnetic layer is magnetized parallel or anti-parallel to the magnetization direction of the third magnetic layer.

6. The electronic device according to claim 1, wherein the first direction is parallel to a surface of the first magnetic layer.

7. The electronic device according to claim 1, wherein the second direction is inclined from the first direction at an angle of greater than 0 degree and less than 90 degrees.

8. The electronic device according to claim 7, wherein the second direction is inclined from a direction vertical to a surface of the first magnetic layer to a direction parallel to the surface of the first magnetic layer.

9. The electronic device according to claim 1, wherein the second direction is inclined from the first direction at an angle of greater than 90 degrees and less than 180.

10. The electronic device according to claim 1, wherein the second direction is inclined from the first direction at an angle of greater than 180 degrees and less than 270 degrees.

11. The electronic device according to claim 1, wherein the second direction is inclined from the first direction at an angle of greater than 270 degrees and less than 360 degrees.

12. The electronic device according to claim 1, further comprising an anti-ferromagnetic layer that contacts with the third magnetic layer.

13. The electronic device according to claim 1, wherein the first magnetic layer comprises a lower magnetic layer, an upper magnetic layer, and a non-magnetic layer interposed between the lower magnetic layer and the upper magnetic layer.

14. The electronic device according to claim 1, further comprising:

a first conductive layer coupled with the first magnetic layer, and a second conductive layer coupled with the third magnetic layer.

15. The electronic device according to claim 14, wherein:

the first conductive layer is a seed layer, and the second conductive layer is a capping layer.

16. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

17. An electronic device comprising a semiconductor memory unit that includes:

a first magnetic layer having an easy magnetization axis in a first direction and having a variable magnetization direction;

a third magnetic layer having a magnetization direction pinned in the first direction;

a second magnetic layer interposed between the first magnetic layer and the third magnetic layer and having a magnetization direction pinned in a second direction different from the first direction;

a tunnel barrier layer interposed between the first magnetic layer and the second magnetic layer; and a non-magnetic layer interposed between the second magnetic layer and the third magnetic layer, wherein the second direction is inclined from the first direction at an angle of greater than 0 degree and less than 90 degrees and the second direction is inclined from a direction vertical to a surface of the first magnetic layer to a direction parallel to the surface of the first magnetic layer.

* * * * *